(12) United States Patent
Zhao et al.

(10) Patent No.: US 10,566,262 B2
(45) Date of Patent: Feb. 18, 2020

(54) THERMAL INTERFACE MATERIALS WITH WEAR-RESISTING LAYERS AND/OR SUITABLE FOR USE BETWEEN SLIDING COMPONENTS

(71) Applicant: Laird Technologies, Inc., Chesterfield, MO (US)

(72) Inventors: Jingqi Zhao, Tianjin (CN); Licai Jiao, Tianjin (CN)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 16/127,853

(22) Filed: Sep. 11, 2018

(65) Prior Publication Data

US 2019/0080981 A1   Mar. 14, 2019

(30) Foreign Application Priority Data

Sep. 12, 2017  (CN) .......................... 2017 1 0815231
Sep. 12, 2017  (CN) ..................... 2017 2 1160679 U

(51) Int. Cl.
| | | |
|---|---|---|
| *H01L 31/0203* | (2014.01) | |
| *H01L 23/373* | (2006.01) | |
| *H01L 31/024* | (2014.01) | |
| *H01L 23/31* | (2006.01) | |

(52) U.S. Cl.
CPC .......... *H01L 23/3737* (2013.01); *H01L 23/31* (2013.01); *H01L 31/0203* (2013.01); *H01L 31/024* (2013.01)

(58) Field of Classification Search
CPC combination set(s) only.
See application file for complete search history.

(56) References Cited

U.S. PATENT DOCUMENTS

| | | | |
|---|---|---|---|
| 6,097,598 A | * | 8/2000 | Miyahara ............ H01L 23/3732 165/185 |
| 8,535,787 B1 | * | 9/2013 | Lima ........................ B32B 7/12 165/185 |
| 8,599,559 B1 | | 12/2013 | Morrison et al. |
| 2010/0027220 A1 | | 2/2010 | Hughes et al. |
| 2010/0178783 A1 | | 7/2010 | Bright et al. |
| 2014/0170898 A1 | * | 6/2014 | Elison ................ H05K 7/20454 439/487 |
| 2017/0251571 A1 | * | 8/2017 | Chien ................... F28F 21/067 |
| 2018/0034492 A1 | | 2/2018 | Edgren et al. |

FOREIGN PATENT DOCUMENTS

CN           106932865 A        7/2017

\* cited by examiner

*Primary Examiner* — Dung A. Le
(74) *Attorney, Agent, or Firm* — Harness, Dickey & Pierce, P.L.C.; Anthony G. Fussner

(57) ABSTRACT

Exemplary embodiments are disclosed of thermal interface materials with wear-resisting layers and/or suitable for use between sliding components. Also disclosed are devices including thermal interface materials and methods of using thermal interface materials.

20 Claims, 2 Drawing Sheets

THERMAL INTERFACE MATERIALS WITH WEAR-RESISTING LAYERS AND/OR SUITABLE FOR USE BETWEEN SLIDING COMPONENTS

CROSS-REFERENCE TO RELATED APPLICATIONS

This application claims the benefit and priority of Chinese Utility Model Application No. 201721160679.6 filed Sep. 12, 2017 and Chinese Invention Patent Application No. 201710815231.1 filed Sep. 12, 2017. The entire disclosures of the above applications are incorporated herein by reference.

FIELD

The present disclosure generally relates to thermal interface materials with wear-resisting layers and/or suitable for use between sliding components.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
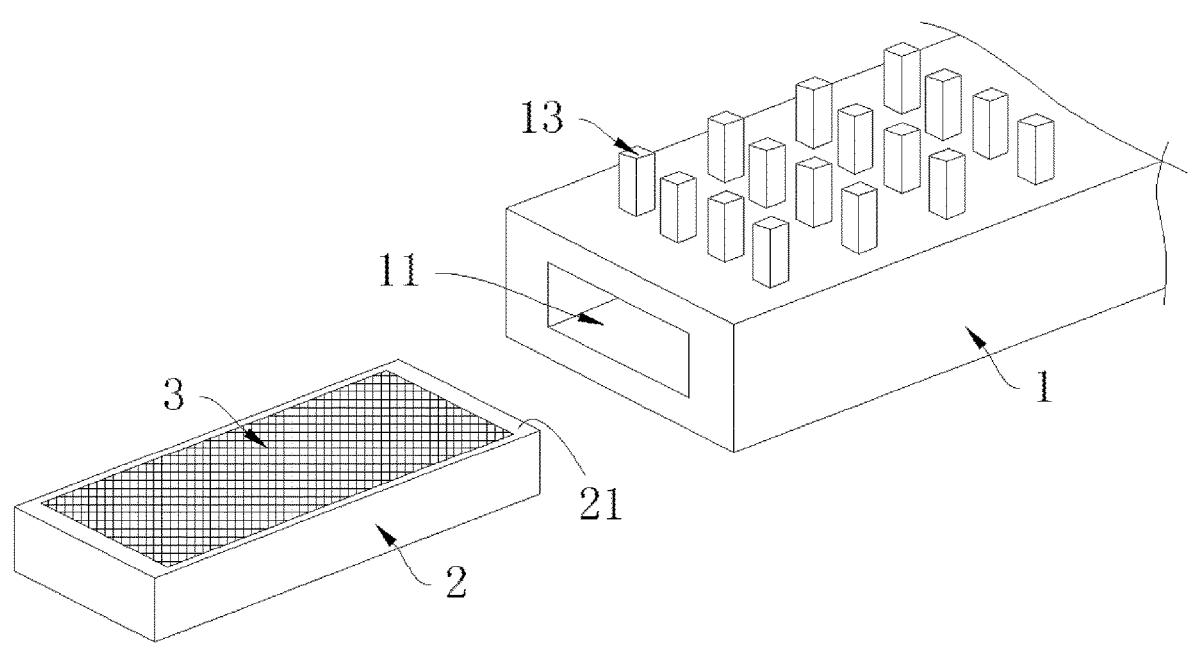
FIG. 1 is a perspective view of a device according to an exemplary embodiment of the present disclosure.

Example embodiments will now be described more fully with reference to the accompanying drawings.

With the advancement of communication technologies, the power of communication equipment is becoming increasingly larger, while the volume of communication equipment is continuously being decreased. This creates thermal issues and challenges as it can be difficult to transfer heat from an optical module to a cage as the optical module's power becomes higher and higher. Because optical modules must be slidably plugged into and slidably unplugged from the cages from time to time, conventional thermal interface materials may not have sufficient abrasion resistance to avoid damage during the repeated plugging and unplugging of the optical module. In which case, a conventional thermal interface material's thermal performance may be negatively impacted.

After recognizing the above, exemplary embodiments are developed and disclosed herein of thermal interface materials having good abrasion resistance, e.g., to resist abrasion during connector plug insertion into and/or removal from cages or housings. Also disclosed are exemplary embodiments of devices (e.g., photoelectric conversion devices, transceivers, etc.) including thermal interface materials having good abrasion resistance.

In an exemplary embodiment, a photoelectric conversion device (broadly, a device) generally includes a housing having or defining an accommodating cavity. The cavity opens at one end and has an inner surface. The device further includes an optical module having an arrangement surface corresponding to the inner surface of the housing. A thermal interface material or heat transfer member is disposed along (e.g., attached on, etc.) the arrangement surface of the optical module. The thermal interface material has a wear-resisting layer that faces the inner surface of the cavity of the housing. The optical module may be inserted into or pulled out from the housing's cavity through the open end with the wear-resisting layer of the thermal interface material in contact with (e.g., sliding along with friction therebetween, etc.) the housing's inner surface instead of the optical module's arrangement surface.

The photoelectric conversion device may include a plurality of radiation or heat-transferring fins along a top wall of the housing.

The wear-resisting layer may comprise a wear-resisting matrix and a first thermal conductor (e.g., thermally-conductive filler or particles, etc.) therein. The wear-resisting matrix may be any one or a mixture of one or more of organic silicone resin, acrylic resin, epoxy resin, and polyamide resin. The first thermal conductor may comprise an aggregation of thermally-conductive particles, e.g., combination of two or more different thermally-conductive particles, etc. The wear-resisting layer may have a hardness of Shore A of 60 to 90.

The thermal interface material may further comprise a viscous layer opposite to the wear-resisting layer. The thermal interface material may be bonded to the arrangement surface of the optical module through the viscous layer. The viscous layer may comprise a viscous matrix and a second thermal conductor (e.g., thermally-conductive filler or particles, etc.) provided therein. The viscous matrix may be any one or a mixture of one or more of organic silicone resin, organic silicone pressure-sensitive adhesive, acrylic resin, acrylic pressure-sensitive adhesive, MQ resin, tackifier resin, epoxy resin, and polyamide resin. The second thermal conductor may be an aggregation of thermally-conductive particles, e.g., combination of two or more different thermally-conductive particles, etc.

The thermal interface material may further comprise a carrier support layer. The viscous layer and the wear-resisting layer may be along or provided on two opposing sides of the carrier support layer, respectively. The carrier support layer may comprise any one of polyimide film, polyethylene naphthalate, polyethylene terephthalate (PET) film, polypropylene (PP) film, copper foil, aluminum foil, and glass fiber cloth.

Exemplary embodiments disclosed herein may provide or include one or more (but not necessarily any or all) of the following advantageous effects or features. By positioning (e.g., attaching, etc.) the thermal interface material along or on a surface of an optical module, the thermal interface material's wear-resisting layer faces the inner surface of the cavity of the housing. When the optical module is slidably inserted into or slidably pulled out via the opening of the cavity, the wear-resisting layer may therefore contact (e.g., frictionally contact, slidably contact, etc.) the inner surface of the cavity instead of having the surface of the optical module contact the inner surface of the cavity. Direct contact and direct friction between the optical module and the inner surface of the housing's cavity is thereby avoided. This also decreases wearing of the thermal interface material, which may otherwise decrease the heat transfer capability of the thermal interface material. When the optical module is inserted into the cavity of the housing, the wear-resisting layer may be along (e.g., in thermal contact with, etc.) the inner surface of the cavity, which may help reduce heat resistance along the interface. and transfer heat generated by the optical module to the inner surface thereby providing a good thermal performance.

Figure 2:
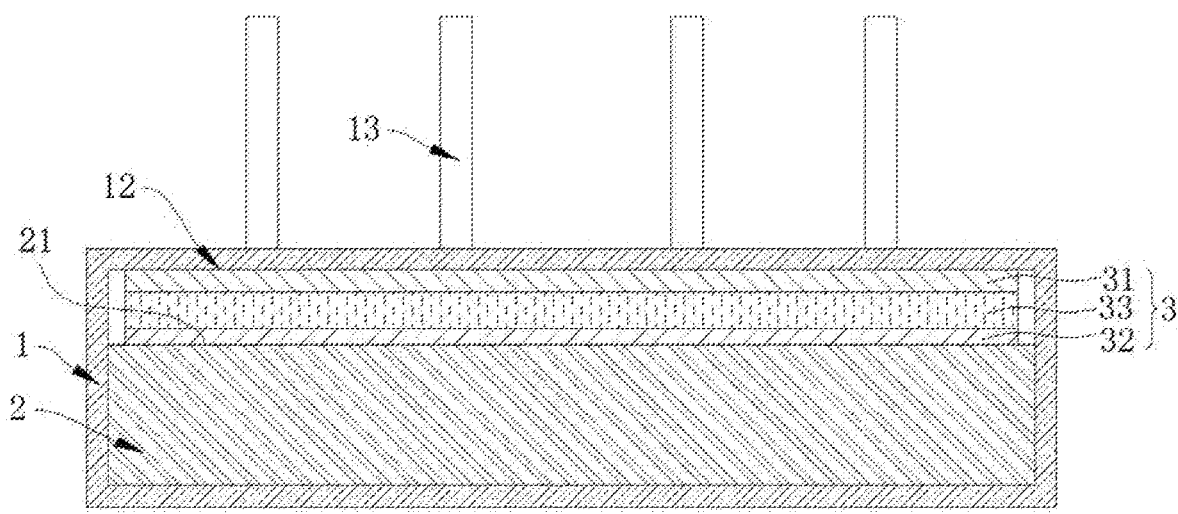
FIG. 2 is a cross-sectional view of the device shown in FIG. 1.

With reference now to the figures, FIGS. 1 and 2 illustrate an exemplary embodiment of a photoelectric conversion device (broadly, a device) embodying one or more aspects of the present disclosure. As shown, the device includes a housing 1, an optical module 2, and a thermal interface material or heat transfer member 3.

The housing 1 has or defines an accommodating cavity 11. The cavity 11 has an opening at one end. As shown in FIG. 2, the housing's cavity 11 includes or is defined at least partially by an inner surface 12.

The optical module 2 includes an arrangement surface 21 (broadly, a surface) corresponding to the inner surface 12 along or within the cavity 11. The thermal interface material 3 is along (e.g., attached to, etc.) the arrangement surface 21 of the optical module 2.

With continued reference to FIG. 2, the thermal interface material 3 includes a wear-resisting layer 31 that faces the inner surface 12 of the cavity 11. The wear-resisting layer 31 is along the inner surface 12 within the cavity 11. The optical module 2 may be slidably inserted into or slidably pulled out of the cavity 11 through the opening, while the wear-resisting layer 31 is in contact with (e.g., slidably engaged with, in frictional contact with, etc.) the inner surface 12 of the cavity 11 in place of the arrangement surface 21 of the optical module 2. Accordingly, the wear-resisting layer 31 may thus be an intervening layer between the inner surface 12 of the cavity 11 and the optical module 2.

In this exemplary embodiment, the thermal interface material 3 is attached to the optical module 2. The thermal interface material includes the wear-resisting layer 31 facing the inner surface 12 of the cavity 11. When the optical module 2 is slidably inserted into or slidably pulled out from the cavity 11 through the opening, the wear-resisting layer 31 intervenes between the inner surface 12 of the cavity 11 and the optical module's arrangement surface 21, such that direct contact (e.g., direct sliding friction, etc.) between the thermal interface material 3 and the inner surface 12 of the cavity 11 is avoided. This, in turn, helps to avoid decreased thermal performance of the thermal interface material 3 due to the wearing of the thermal interface material 3. In addition, when the optical module 2 is slidably inserted into the cavity 11, the wear-resisting layer 31 may thermally contact (e.g., direct physical contact, etc.) the inner surface 12 of the cavity 11. The thermal contact between the wear-resisting layer 31 and the inner surface 12 of the cavity 11 may reduce heat transfer resistance along the interface therebetween. With the reduced heat transfer resistance, the transfer of the heat generated by the optical module 2 may be improved and/or good.

Exemplary embodiments of the present disclosure improve the layered structure design of the thermal interface material 3 so that it has a wear-resisting layer 31 with good wear resistance. When the optical module 2 is inserted into or pulled out from the cavity 11, the wear-resisting layer 31 intervenes for the arrangement surface 21 of the optical module 2 such that the wear-resisting layer 31 contacts the inner surface 12 of the cavity 11. Accordingly, the optical module's arrangement surface 21 does not contact the inner surface 12 of the cavity 11. The wear-resisting layer 31 reduces the wearing of the thermal interface material 3 during the insertion and pullout of the optical module 2. Therefore, exemplary embodiments disclosed herein may provide good thermal performance and abrasion resistance without requiring conventional brackets or other conventional mechanical adjustment mechanisms.

In the illustrated embodiment shown in FIGS. 1 and 2, the housing 1 is substantially rectangular and may be made of a metal material. The housing 1 may include an plurality of heat dissipation or radiation fins 13 (broadly, heat dissipation structures) protruding outwardly from a wall (e.g., a top wall, etc.) of the housing. The fins 13 may be arranged in multiple rows and columns, arranged in a ring or rectangular array, etc.

In this exemplary embodiment, each fin 13 is substantially columnar, such as cylindrical, prismatic, slatted etc. Each fin 13 may be made of a metal material. By providing the plurality of fins 13 along the outer wall of the housing 1, the heat radiation area may be increased and the heat radiation efficiency may be improved.

In an exemplary embodiment, the wear-resisting layer 31 may include a wear-resisting matrix and a first thermal conductor (e.g., aluminum oxide, zinc oxide, boron nitride, aluminum nitride, silicon carbide, other thermally-conductive fillers, etc.) added to or loaded in the wear-resisting matrix. The wear-resisting matrix may be any one or a mixture of one or more of organic silicone resin, acrylic resin, epoxy resin, and polyamide resin. After mixing of the resin(s), a physical cross-linking reaction may occur such that the hardness of the material increases, the surface of the material becomes smooth, and the material is wear resistant. The first thermal conductor may be an aggregation of one or more thermally-conductive particles (e.g., a combination of two different types of thermally-conductive particles, etc.). The first thermal conductor and the wear-resisting matrix may have a volume ratio of from 40:60 to 80:20.

The wear-resisting layer 31 may be formed by adding one or more of aluminum oxide, zinc oxide, boron nitride, aluminum nitride, silicon carbide and the like into any one of organic silicone resin, acrylic resin, epoxy resin, and polyamide resin.

Further, the wear-resisting layer 31 may be formulated to have a relatively large hardness. For example, the wear-resisting layer 31 may have a Shore A hardness of 60 to 90 such that the wear-resisting layer has good wear resistance. In addition, the friction coefficient of the wear-resisting layer 31 may be relatively is small, such that frictional resistance is decreased when the optical module 2 is inserted into and pulled out of the cavity 11, which, in turn, further reduces wearing otherwise caused by the frictional resistance.

As illustrated in FIG. 2, the thermal interface material 3 may further comprise a viscous layer 32 along a side of the thermal interface material 3 opposite the wear-resisting layer 31. The thermal interface material 3 may be attached along or on the optical module's arrangement surface 21 through the viscous layer 32. For example, the viscous layer 31 may be naturally tacky such that the viscous layer 32 may be used to bond the thermal interface material 3 to optical module's arrangement surface 21. In this exemplary way, the thermal interface material 3 may be relatively securely attached to the arrangement surface 21 of the optical module 2, and the interface heat resistance may be reduced between the thermal interface material 3 and the optical module's arrangement surface 21.

In an exemplary embodiment, the viscous layer 32 may comprise a viscous matrix and a second thermal conductor (e.g., aluminum oxide, zinc oxide, boron nitride, aluminum nitride, aluminum powder, silver powder, carbon fiber, silicon carbide, other thermally-conductive fillers, etc.) added to or loaded in the viscous matrix. The viscous matrix may be any one or a mixture of one or more of organic silicone resin, organic silicone pressure-sensitive adhesive, acrylic resin, acrylic pressure-sensitive adhesive, MQ resin, tackifier resin, epoxy resin, and polyamide resin. After mixing the resin(s), a physical cross-linking reaction may occur to produce viscosity. The second thermal conductor may be an aggregation of one or more thermally-conductive particles (e.g., a combination of two different types of thermally-conductive particles, etc.). The second thermal conductor and the viscous matrix may have a volume ratio of from 50:50 to 85:15.

The viscous layer 32 may be formed by adding one or more of aluminum oxide, zinc oxide, boron nitride, aluminum nitride, aluminum powder, silver powder, carbon fiber, silicon carbide and the like into any one of organic silicone resin, organic silicone pressure-sensitive adhesive, acrylic resin, acrylic pressure-sensitive adhesive, MQ resin, tackifier resin, epoxy resin, and polyamide resin.

As illustrated in FIG. 2, the thermal interface material 3 may further comprise a carrier support layer 33 having upper and lower (or first and second) opposite sides. The wear-resisting layer 31 and the viscous layer 32 may be provided along the opposing upper and lower sides of the carrier support layer 33, respectively. The carrier support layer 33 may be manufactured to provide strength for and/or reinforcement to the viscous layer 32 and the wear-resisting layer 31. In an exemplary embodiment, the carrier support layer 33 may be any one of polyimide film, polyethylene naphthalate, polyethylene terephthalate (PET) film, polypropylene (PP) film, copper foil, aluminum foil, and glass fiber cloth.

Experiments have proved that the thermal interface material 3 according to exemplary embodiments disclosed herein has no surface damaged and no peeling thereof after being attached to the optical module 2 and undergoing 50 times of insertion-pull out tests.

For simulation experiments, a lower portion of the thermal interface material 3 was punched and added to an electric heater. The heater and the radiator were punched and filled with a temperature sensor, respectively. After the temperature was constant, a temperature difference between the directly contacted metal heater and metal radiator was measured with the thermal interface material 3 and without the thermal interface material 3 for comparison purposes as shown in Table 1 below

TABLE 1

Example Experimental Comparison

|  | Room Temperature | Temperature of Heater | Temperature of Radiator | Temperature Difference |
| --- | --- | --- | --- | --- |
| Without thermal interface material 3 | 25° C. | 75° C. | 63° C. | 12° C. |
| With thermal interface material 3 | 25° C. | 71° C. | 65° C. | 6° C. |

The simulation experiments show that when there was no thermal interface material 3 between the heater and the radiator, a temperature difference between the surfaces of the heater and the radiator was 12 degrees Celsius. By comparison, the temperature difference between the heater and the radiator was only 6 degrees Celsius when the thermal interface material 3 was between the heater and the radiator. Accordingly, the thermal interface material 3 provided a temperature reduction of 6 degrees Celsius, which may greatly improve performance, reliability and stability.

In an exemplary embodiment, a device generally includes a housing and a component. The housing includes a cavity having an opening and an inner surface within the cavity. The component includes a surface corresponding to the inner surface within the cavity of the housing. The component is configured to be slidably insertable into and slidably removable from the cavity through the opening. A thermal interface material is along the surface of the component. The thermal interface material includes a wear-resisting layer facing the inner surface within the cavity of the housing when the component is within the cavity. When the component is slidably inserted into or removed from the cavity through the opening, the wear-resisting layer contacts the inner surface within the cavity of the housing.

The device may further include one or heat dissipation fins protruding outwardly from a wall of the housing.

The wear-resisting layer may comprise a wear-resisting matrix and a first thermally-conductive filler within the wear-resisting matrix. The wear-resisting matrix may comprise one or more of organic silicone resin, acrylic resin, epoxy resin, and polyamide resin. The first thermally-conductive filler may comprise one or more of aluminum oxide, zinc oxide, boron nitride, aluminum nitride, and silicon carbide. The first thermally-conductive filler and the wear-resisting matrix may have a volume ratio of from 40:60 to 80:20. The wear-resisting layer may have a hardness of Shore A of 60 to 90.

The thermal interface material may include opposite first and second sides. The wear-resisting layer is along the first side of the thermal interface material. The thermal interface material may comprise a viscous layer along the second side of the thermal interface material opposite the wear-resisting layer along the first side of the thermal interface material. The viscous layer may be naturally tacky and/or may be used to attach the thermal interface material to the surface of the component. The viscous layer may comprise a viscous matrix and a second thermally-conductive filler within the viscous matrix. The viscous matrix may comprise one or more of organic silicone resin, organic silicone pressure-sensitive adhesive, acrylic resin, acrylic pressure-sensitive adhesive, MQ resin, tackifier resin, epoxy resin, and polyamide resin. The second thermally-conductive filler may comprise one or more of aluminum oxide, zinc oxide, boron nitride, aluminum nitride, aluminum powder, silver powder, carbon fiber, and silicon carbide. The second thermally-conductive filler and the viscous matrix may have a volume ratio of from 50:50 to 85:15.

The thermal interface material may comprise a carrier support layer including the first and second sides. The wear-resisting layer and the viscous layer may be along the first and second sides, respectively, of the carrier support layer. The carrier support layer may comprise one or more of polyimide film, polyethylene naphthalate, polyethylene terephthalate (PET) film, polypropylene (PP) film, copper foil, aluminum foil, and glass fiber cloth.

The component may comprise a connector. The housing may comprise a cage including the cavity configured to receive the connector.

The device may be a small form-factor pluggable transceiver. The component may comprise a small form-factor pluggable cable connector. The housing may be a small form-factor pluggable cage including the cavity configured to receive the small form-factor pluggable cable connector.

The device may be a photoelectric conversion device. The component may be an optical module including an arrangement surface corresponding to the inner surface within the cavity of the housing. The thermal interface material may be along the arrangement surface of the optical module.

Exemplary embodiments include thermal interface materials suitable for use between sliding components. In an exemplary embodiment, the thermal interface material may generally includes a carrier support layer including opposing first and second sides, a wear-resisting layer along the first side of the carrier support layer, and a viscous layer along the second side of the carrier support layer. The wear-resisting layer may be configured to contact a surface of a first component when the viscous layer of the thermal interface material is along a surface of a second component and when the second component is slid relative to the first component.

In this exemplary embodiment, the wear-resisting layer may comprise a wear-resisting matrix and a first thermally-conductive filler within the wear-resisting matrix. The wear-resisting matrix may comprise one or more of organic silicone resin, acrylic resin, epoxy resin, and polyamide resin. The first thermally-conductive filler may comprise one or more of aluminum oxide, zinc oxide, boron nitride, aluminum nitride, and silicon carbide. The first thermally-conductive filler and the wear-resisting matrix may have a volume ratio of from 40:60 to 80:20. The wear-resisting layer may have a hardness of Shore A of 60 to 90.

The viscous layer may be naturally tacky and/or may be used to attach the thermal interface material to the surface of the component. The viscous layer may comprise a viscous matrix and a second thermally-conductive filler within the viscous matrix. The viscous matrix may comprise one or more of organic silicone resin, organic silicone pressure-sensitive adhesive, acrylic resin, acrylic pressure-sensitive adhesive, MQ resin, tackifier resin, epoxy resin, and polyamide resin. The second thermally-conductive filler may comprise one or more of aluminum oxide, zinc oxide, boron nitride, aluminum nitride, aluminum powder, silver powder, carbon fiber, and silicon carbide. The second thermally-conductive filler and the viscous matrix have a volume ratio of from 50:50 to 85:15.

The carrier support layer may comprise one or more of polyimide film, polyethylene naphthalate, polyethylene terephthalate (PET) film, polypropylene (PP) film, copper foil, aluminum foil, and glass fiber cloth.

A small form-factor pluggable transceiver may include the thermal interface material. In this example, the second component may comprise a small form-factor pluggable cable connector, and the first component may comprise a small form-factor pluggable cage configured to receive the small form-factor pluggable cable connector.

A photoelectric conversion device may include the thermal interface material. In this example, the second component may comprise an optical module including an arrangement surface along which the thermal interface material is disposed. The first component may comprise a housing including a cavity having an opening and configured to slidably receive the optical module. The wear-resisting layer may contact an inner surface within the cavity of the housing when the optical module is slidably inserted into or removed from the cavity through the opening.

Examplary embodiments of methods are also disclosed. An exemplary embodiment includes a method of using thermal interface material with a photoelectric conversion device and an optical module. The method may comprise positioning the thermal interface material along a surface of the optical module such that a wear-resisting layer along the thermal interface material faces an inner surface within a cavity of a housing of the photoelectric conversion device when the optical module is within the cavity. The wear-resisting layer contacts the inner surface within the cavity of the housing when the optical module component is slidably inserted into or removed from the cavity.

Exemplary embodiments are disclosed of thermal interface materials with wear-resisting layers and that are suitable for use between sliding components in a wide range of devices, such as photoelectric conversion devices, transceivers, small form-factor pluggable (SFP) transceivers, SFP+ transceivers, quad small form-factor pluggable (QSFP) transceivers, QSFP+ transceiver, XFP transceivers, tablets, modular portable devices in which parts are slid into place instead of layered on top of each other, etc. As disclosed herein, the thermal interface material may include a wear-resisting layer to resist wearing from abrasion during connector plug insertion into and/or removal from a cage or housing.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific numerical dimensions and values, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (the disclosure of a first value and a second value for a given parameter may be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "has," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A device comprising:
a housing having a cavity including an opening and an inner surface of the housing that is within the cavity;
a component having a surface corresponding to the inner surface within the cavity of the housing, the component configured to be slidably insertable into and slidably removable from the cavity through the opening; and
a thermal interface material attached along the surface of the component, the thermal interface material including a wear-resisting layer facing the inner surface within the cavity of the housing when the component is within the cavity, whereby the wear-resisting layer is configured to slide along in frictional contact with the inner surface within the cavity of the housing when the component is slidably inserted into or removed from the cavity through the opening.

2. The device of claim 1, wherein:
the component comprises a connector configured to be slidably plugged into and slidably unplugged from the housing; and
the thermal interface material is attached along a surface of the connector such that the wear-resisting layer positioned to intervene between the thermal interface material and the inner surface of the housing and such that the wear-resisting layer slides along in frictional contact with the inner surface of the housing when the connector is slidably plugged into or slidably unplugged from the cavity through the opening, whereby the wear-resisting layer provides abrasion resistance and decreases wearing of the thermal interface material during connector plug insertion into and removal from the housing.

3. The device of claim 1, wherein the wear-resisting layer comprises a wear-resisting matrix and a first thermally-conductive filler within the wear-resisting matrix.

4. The device of claim 1, wherein:
the wear-resisting matrix comprises one or more of organic silicone resin, acrylic resin, epoxy resin, and polyamide resin; and/or
the first thermally-conductive filler comprises one or more of aluminum oxide, zinc oxide, boron nitride, aluminum nitride, and silicon carbide; and/or
the first thermally-conductive filler and the wear-resisting matrix have a volume ratio of from 40:60 to 80:20.

5. The device of claim 1, wherein the wear-resisting layer has a hardness of Shore A of 60 to 90.

6. The device of claim 1, wherein:
the thermal interface material includes opposite first and second sides;
the wear-resisting layer is along the first side of the thermal interface material; and
the thermal interface material further comprises a viscous layer along the second side of the thermal interface material opposite the wear-resisting layer along the first side of the thermal interface material.

7. The device of claim 6, wherein the viscous layer is naturally tacky and/or attaches the thermal interface material to the surface of the component.

8. The device of claim 6, wherein the viscous layer comprises a viscous matrix and a second thermally-conductive filler within the viscous matrix.

9. The device of claim 8, wherein:
the viscous matrix comprises one or more of organic silicone resin, organic silicone pressure-sensitive adhesive, acrylic resin, acrylic pressure-sensitive adhesive, MQ resin, tackifier resin, epoxy resin, and polyamide resin; and/or
the second thermally-conductive filler comprises one or more of aluminum oxide, zinc oxide, boron nitride, aluminum nitride, aluminum powder, silver powder, carbon fiber, and silicon carbide; and/or
the second thermally-conductive filler and the viscous matrix have a volume ratio of from 50:50 to 85:15.

10. The device of claim 6, wherein:
the thermal interface material further comprises a carrier support layer including the first and second sides; and
the wear-resisting layer and the viscous layer are along the first and second sides, respectively, of the carrier support layer.

11. The device of claim 10, wherein the carrier support layer comprises one or more of polyimide film, polyethylene naphthalate, polyethylene terephthalate (PET) film, polypropylene (PP) film, copper foil, aluminum foil, and glass fiber cloth.

12. The device of claim 1, wherein:
the component comprises a connector;
the housing comprises a cage including the inner surface therein and the cavity configured to slidably receive the connector; and
the thermal interface material is attached along a surface of the connector such that the wear-resisting layer is positioned to intervene between the thermal interface material and the inner surface of the cage, whereby the wear-resisting layer slides along in frictional contact with the inner surface of the cage when the connector is slidably inserted into or slidably removed from the cavity through the opening.

13. The device of claim 12, wherein
the wear-resisting layer comprises a wear-resisting matrix and a first thermally-conductive filler within the wear-resisting matrix;
the wear-resisting matrix comprises one or more of organic silicone resin, acrylic resin, epoxy resin, and polyamide resin;
the first thermally-conductive filler comprises one or more of aluminum oxide, zinc oxide, boron nitride, aluminum nitride, and silicon carbide;
the first thermally-conductive filler and the wear-resisting matrix have a volume ratio of from 40:60 to 80:20;
the wear-resisting layer has a hardness of Shore A of 60 to 90;
the thermal interface material includes opposite first and second sides;
the wear-resisting layer is along the first side of the thermal interface material;
the thermal interface material further comprises a viscous layer along the second side of the thermal interface material opposite the wear-resisting layer along the first side of the thermal interface material;
the viscous layer is naturally tacky and/or attaches the thermal interface material to the surface of the component;
the viscous layer comprises a viscous matrix and a second thermally-conductive filler within the viscous matrix;
the viscous matrix comprises one or more of organic silicone resin, organic silicone pressure-sensitive adhesive, acrylic resin, acrylic pressure-sensitive adhesive, MQ resin, tackifier resin, epoxy resin, and polyamide resin;
the second thermally-conductive filler comprises one or more of aluminum oxide, zinc oxide, boron nitride, aluminum nitride, aluminum powder, silver powder, carbon fiber, and silicon carbide;
the second thermally-conductive filler and the viscous matrix have a volume ratio of from 50:50 to 85:15;
the thermal interface material further comprises a carrier support layer including the first and second sides;
the wear-resisting layer and the viscous layer are along the first and second sides, respectively, of the carrier support layer; and
the carrier support layer comprises one or more of polyimide film, polyethylene naphthalate, polyethylene terephthalate (PET) film, polypropylene (PP) film, copper foil, aluminum foil, and glass fiber cloth.

14. The device of claim 1, wherein:
the device is a small form-factor pluggable transceiver, the component comprises a small form-factor pluggable cable connector, and the housing is a small form-factor pluggable cage including the inner surface therein and the cavity configured to receive the small form-factor pluggable cable connector, and the thermal interface material is attached along a surface of the small form-factor pluggable cable connector such that the wear-resisting layer is positioned to intervene between the thermal interface material and the inner surface of the small form-factor pluggable cage, whereby the wear-resisting layer slides along in frictional contact with the inner surface of the small form-factor pluggable cage when the small form-factor pluggable connector is slidably inserted into or slidably removed from the cavity; or the device is a photoelectric conversion device, the component is an optical module including an arrangement surface corresponding to the inner surface within the cavity of the housing, and the thermal interface material is attached along the arrangement surface of the optical module such that the wear-resisting layer is positioned to intervene between the thermal interface material and the inner surface of the housing, whereby the wear-resisting layer slides along in frictional contact with the inner surface of the housing when the optical module is slidably inserted into or slidably removed from the cavity.

15. A thermal interface material suitable for use between sliding components, the thermal interface material comprising:
   a carrier support layer including opposing first and second sides;
   a wear-resisting layer along the first side of the carrier support layer; and
   a viscous layer along the second side of the carrier support layer;
   whereby the wear-resisting layer is configured to slide along in frictional contact with a surface of a first component when the viscous layer of the thermal interface material is along a surface of a second component and when the second component is slidably connected with or slidably removed from the first component, the wear-resisting layer configured to provide abrasion resistance and decrease wearing of the thermal interface material during sliding of the second component relative to the first component.

16. The thermal interface material of claim 15, wherein:
   the wear-resisting layer comprises a wear-resisting matrix and a first thermally-conductive filler within the wear-resisting matrix;
   the wear-resisting matrix comprises one or more of organic silicone resin, acrylic resin, epoxy resin, and polyamide resin;
   the first thermally-conductive filler comprises one or more of aluminum oxide, zinc oxide, boron nitride, aluminum nitride, and silicon carbide;
   the first thermally-conductive filler and the wear-resisting matrix have a volume ratio of from 40:60 to 80:20; and
   the wear-resisting layer has a hardness of Shore A of 60 to 90.

17. The thermal interface material of claim 15, wherein:
   the viscous layer is naturally tacky and/or attaches the thermal interface material to the surface of the second component;
   the viscous layer comprises a viscous matrix and a second thermally-conductive filler within the viscous matrix;
   the viscous matrix comprises one or more of organic silicone resin, organic silicone pressure-sensitive adhesive, acrylic resin, acrylic pressure-sensitive adhesive, MQ resin, tackifier resin, epoxy resin, and polyamide resin;
   the second thermally-conductive filler comprises one or more of aluminum oxide, zinc oxide, boron nitride, aluminum nitride, aluminum powder, silver powder, carbon fiber, and silicon carbide; and
   the second thermally-conductive filler and the viscous matrix have a volume ratio of from 50:50 to 85:15.

18. The thermal interface material of claim 15, wherein the carrier support layer comprises one or more of polyimide film, polyethylene naphthalate, polyethylene terephthalate (PET) film, polypropylene (PP) film, copper foil, aluminum foil, and glass fiber cloth.

19. A device comprising the thermal interface material of claim 15, wherein:
   the device is a small form-factor pluggable transceiver;
   the second component comprises a small form-factor pluggable cable connector;
   the first component comprises a small form-factor pluggable cage configured to receive the small form-factor pluggable cable connector; and
   the thermal interface material is attached along a surface of the small form-factor pluggable cable connector such that the wear-resisting layer is positioned to intervene between the thermal interface material and an inner surface within the small form-factor pluggable cage, whereby the wear-resisting layer slides along in frictional contact with the inner surface of the small form-factor pluggable cage when the small form-factor pluggable connector is slidably inserted into or slidably removed from the small form-factor pluggable cage; or
   wherein:
   the device is a photoelectric conversion device;
   the second component is an optical module including an arrangement surface along which the thermal interface material is disposed;
   the first component comprises a housing including a cavity having an opening and configured to slidably receive the optical module,
   the thermal interface material is attached along the arrangement surface of the optical module such that the wear-resisting layer is positioned to intervene between the thermal interface material and an inner surface of the housing that is within the cavity, whereby the wear-resisting layer slides along in frictional contact with the inner surface within the cavity of the housing when the optical module is slidably inserted into or removed from the cavity through the opening.

20. A method of using a thermal interface material with a photoelectric conversion device and an optical module, the method comprising attaching the thermal interface material along a surface of the optical module such that a wear-resisting layer along the thermal interface material faces an inner surface within a cavity of a housing of the photoelectric conversion device when the optical module is within the cavity, whereby the wear-resisting layer is configured to intervene between the thermal interface material and the inner surface of the housing that is within the cavity such that the wear-resisting layer slides along in frictional contact with the inner surface within the cavity of the housing when the optical module is slidably inserted into or removed from the cavity, whereby the wear-resisting layer provides abrasion resistance and decreases wearing of the thermal interface material during the optical module sliding insertion into and removal from the housing.

* * * * *